United States Patent [19]

Banton et al.

[11] Patent Number: 4,699,446

[45] Date of Patent: Oct. 13, 1987

[54] DYNAMIC POWER CONTROL FOR AN EXTERNAL CAVITY STABILIZED LASER DIODE IN A HOLOGRAPHIC SCANNER

[75] Inventors: Martin E. Banton, Fairport; Robert A. Lonis, Williamson, both of N.Y.

[73] Assignee: Xerox Corporation, Stamford, Conn.

[21] Appl. No.: 713,144

[22] Filed: Mar. 18, 1985

[51] Int. Cl.⁴ .............................................. G02B 26/10
[52] U.S. Cl. ..................... 350/3.71; 372/18; 372/43
[58] Field of Search ............ 350/3.71, 6.7, 6.8; 372/18, 19, 43

[56] References Cited

U.S. PATENT DOCUMENTS

| | | | |
|---|---|---|---|
| 3,651,424 | 3/1972 | Ueno et al. | 331/94.5 |
| 3,898,583 | 8/1975 | Shuey | 331/94.5 S |
| 4,097,731 | 6/1978 | Krause et al. | 250/205 |
| 4,237,427 | 12/1980 | Holland | 331/94.5 S |
| 4,428,643 | 1/1984 | Kay | 350/3.71 |
| 4,516,242 | 5/1985 | Yokota | 372/29 |
| 4,548,463 | 10/1985 | Cato et al. | 350/3.71 |

OTHER PUBLICATIONS

Stockton et al., "Injection Laser Diode Transmitter Design", Oct. 1982, pp. 93–96.
A. Olsson, "Properties & Application of External Cavity Semi-Conductor Lasers", Chapter 2—The External Cavity Semiconductor Laser, Jan. 1982, pp. 10–39.

Primary Examiner—Bruce Y. Arnold
Attorney, Agent, or Firm—Frederick E. McMullen

[57] ABSTRACT

A dynamic power control for an external cavity stabilized laser diode adapted for use with a Raster Output Scanner employing a photodiode to convert light emitted from the rear facet of the diode internal cavity to an electrical signal, and a comparator for comparing the light intensity signal with a reference signal and adjusting the drive current input to the diode to maintain diode output pwer constant. In a second embodiment, diode power is taken from the zero order beam at the external cavity transmissive wavelength selecting grating, in a third embodiment from the external cavity output beam, and in a fourth embodiment, from the zero order beam that passes through the holographic disc facets.

12 Claims, 5 Drawing Figures

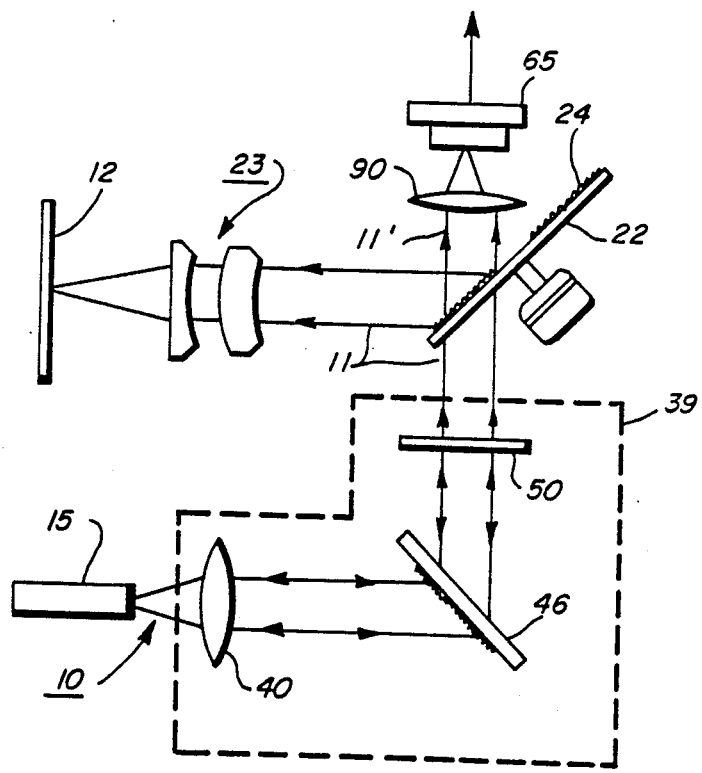

DYNAMIC POWER CONTROL FOR AN EXTERNAL CAVITY STABILIZED LASER DIODE IN A HOLOGRAPHIC SCANNER

The invention relates to a laser power control, and more particularly to a power control for an external cavity laser diode of a raster output scanner.

A Raster Output Scanner or ROS produces images by raster scanning a recording member such as the photoreceptor of a xerographic system with a high intensity beam modulated in accordance with an image signal input. Typically a galvanometer driven mirror or multi-faceted polygon is used to scan the beam across the recording member with the beam itself derived from a gas laser. More recently, a holographic disc or hologon with a laser diode, which by virtue of its internal modulating capability avoids the need for an external modulator of the type required by a gas laser, has been considered.

Unfortunately, under pulsed operation, the lasing wavelength of a laser diode "hops" from mode to mode as the laser junction temperature changes in response to drive current pulses. Further, the scan angle in a holographic scanner is wavelength dependent and thus, laser mode hopping results in discontinuous movement of the laser spot at the recording member, resulting in unexposed areas where exposed areas should instead be present. To prevent mode hopping and the resulting adverse effect on print quality, an external cavity may be used to hold the lasing wavelength fixed in both pulsed and dc operation.

However, while an operational external cavity can eliminate mode hopping, an unfortunate side effect is the change in power output of the cavity during the first few microseconds after the application of a current pulse. This power variation is due to the same phenomenon, i.e. temperature changes at the laser junction, that in the absence of a external cavity leads to laser mode hopping. Unfortunately too, these power variations are found to be considerably larger than those for isolated laser diodes. As a consequence, the use of an external cavity is perceived as obtaining wavelength stability at the expense of power stability.

While it may be possible to design an external cavity laser diode that will work satisfactorily for lower quality printing systems, where higher quality performance and/or greater latitude in the external cavity components, alignment, and temporal stability are desired, it is imperative that the aforedescribed power fluctuations be eliminated.

The invention seeks to correct the foregoing problems and enhance the use of a laser diode in a raster output scanner having a laser diode as the source of a high intensity scanning beam, the scanner having an optical system for scanning and focusing the scanning beam on a recording member, the optical system including means for converting the laser diode internal lasing cavity to an external lasing cavity, means for collimating the light output of the diode into parallel light beams, grating means for dispersing the light beams in accordance with the wavelength of the individual light beams, and means to reflect a predetermined one of the light beams back on itself and against the rear facet in the laser diode internal cavity thereby forcing the laser diode to operate in a single mode corresponding to the wavelength of the predetermined light beam; in which the improvement comprises: means for sampling the power output of the laser diode to provide a signal representing diode power output; means for comparing the signal with a preselected reference signal to provide a control signal; and means for adjusting the power input to the laser diode in response to the control signal.

IN THE DRAWINGS

FIG. 5 is a schematic view of a fourth embodiment in which the intensity of the zero order beam after passing through the facets of the scanning holographic disc is monitored.

Figure 1:
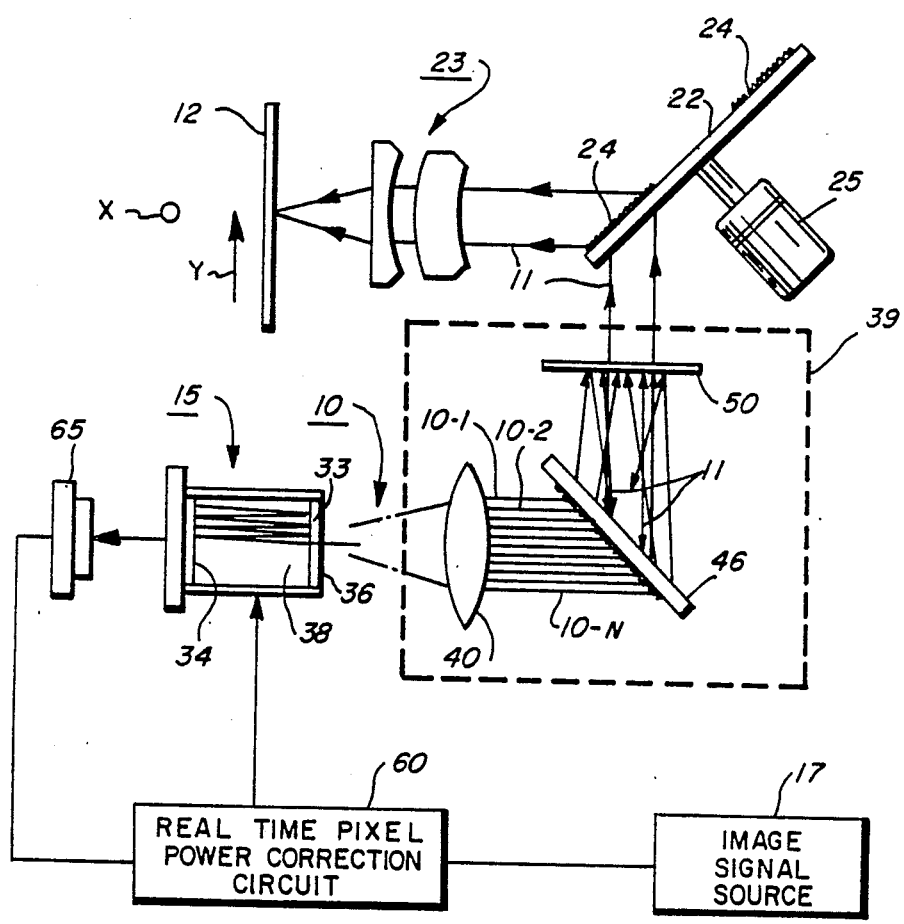
FIG. 1 is a schematic view of a Raster Output Scanner having a scanning beam derived from an external cavity stabilized laser diode and incorporating the laser diode power control of the present invention with laser beam intensity monitored through the rear facet of the laser diode.

Referring to FIG. 1 of the drawings, there is shown a Raster Output Scanner or ROS in which a high intensity laser beam 10, modulated in accordance with an image signal source 17, is scanned across a recording member 12 to selectively expose member 12. The image produced on the recording member 12 is thereafter developed to provide a visible image.

Recording member 12 may comprise any suitable recording medium such as the photoreceptor of a xerographic type imaging system. In systems of that type, the photoreceptor is first uniformly charged and then exposed by beam 10 to form the latent electrostatic image thereon represented by the image signal input. The latent electrostatic image is thereafter developed and the developed image transferred to a suitable copy substrate material such as paper. Following transfer, the image is fixed as by fusing to form a permanent image.

As will be understood, recording member 12 may be in any suitable form such as drum, web, belt, etc.

Beam 10 is generated by a suitable laser diode 15 which may, for example, comprise a Hitachi Model No. 7801E diode. An internal modulating circuit enables the beam output by diode 15 to be modulated by the image signal input. The image signal source 17 may comprise a memory, an input scanner, communication channel, etc.

To control and prevent mode hopping, laser diode 15 is modified to change the diode from an internal cavity type to an external cavity type. As a result, the diode internal cavity 38 is used as a gain medium only. Changeover is accomplished by coating the mirrored surface of the front facet 33 of the diode internal cavity with a suitable anti-reflective coating 36 such as silicon monoxide (SiO), substantially reducing the reflective efficiency of facet 33 and increasing losses within cavity 38 to a point where, at normal operating currents, losses substantially exceed gain. As a result, the threshold current for the external cavity is less than the threshold current for the internal cavity so that the external cavity parameters control the operation.

An external cavity, designed generally by the numeral 39, is formed having a suitable collimating objective lens 40 for collimating light emitted by diode 15 into a parallel bundle of light beams 10-1, 10-2 . . . 10-n, it being understood that the light output of diode 15 is typically multiwavelength due to laser mode hoping. A transmissive wavelength selecting element, illustrated here by grating 46, disperses the light in accordance with the wavelength of the individual light beams 10-1, 10-2, . . . 10-n that comprise the light output of diode 15 onto a suitable partially reflecting mirror 50. Mirror 50 reflects one beam from the multiple beams 10-1, 10-2, . . . 10-n (the reflected beam is identified herein as beam 11) of a selected wavelength back on itself and back through grating 46 and collimating lens 40 onto front facet 33 of the diode internal cavity 38. This forces diode 15 to operate in a single mode at the selected wavelength whereas other component beams are not reflected back onto themselves and hence do not return to the gain medium. This stabilizes diode operation and prevents mode hopping.

External cavity 39 is tuned to select the operating wavelength desired. This may be effected by adjusting the angular relationship between grating 46 and mirror 50 by separate motion or by motion in unison.

The reflected beam 11 of light output from external cavity 39 is impinged at an angle of substantially 45° on the grating facets 24 of a rotating holographic disc 22. Disc 22 has a succession of facets 24 about the periphery thereof such that on rotation of disc 22 by motor 25, each facet 24 scans the beam 11 across recording member 12 in the X direction shown in FIG. 1. Concurrently, recording member 12 is moved by a suitable drive means (not shown) in the Y direction shown by the solid line arrow in FIG. 1. A suitable lens 23 downstream of disc 22 focuses beam 11 to a point on recording member 12.

In order to stabilize the power or intensity of beam 11, particularly during the first few microseconds after the application of a current pulse to laser diode 15, a real time pixel power correction circuit, designated generally by the number 60, is provided. Correction circuit 60 monitors the light output of diode 15 and adjusts the drive current through the diode in such a way as to maintain light output constant as will appear.

Figure 2:
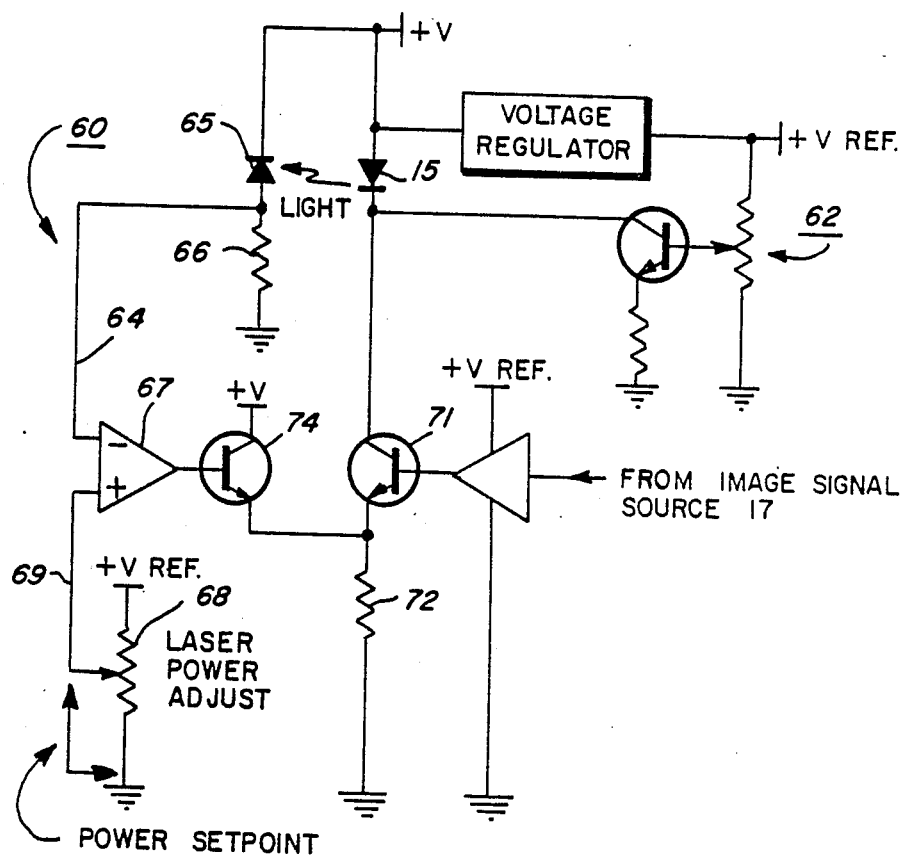
FIG. 2 is a circuit diagram of the real time pixel power correction circuit for controlling power in response to laser beam intensity.

Referring particularly to FIG. 2 of the drawings, pixel power correction circuit 60 has an adjustable biasing circuit 62 for placing a predetermined bias on diode 15. A monitor photodiode 65 is provided in the path of light emitted through the rear facet 34 of diode 15, the photocurrent produced by photodiode 65 being input to resistor 66 through line 64. As a result, a voltage level reflecting the light intensity output of diode 15 is provided at the negative (−) input of a comparison amplifier 67. The positive (+) input of amplifier 67 is preset to a desired power setpoint voltage level by laser power adjusting resistor 68 through line 69.

The image signal input from image signal source 17 to a transistor 71 controls laser diode sink current to a resistor 72. A transistor 74 controls the reduction current input to the sink current circuit in response to the output of amplifier 67.

In the absence of an image signal, transistor 71 is open and therefore does not sink current through diode 15. As a result, diode 15 does not emit light. Since diode 15 does not emit light, there is no photocurrent from monitor photodiode 65 into resistor 66 with the result that the voltage at the negative input of amplifier 67 is below the power setpoint voltage established by resistor 68. Thus, the output of amplifier 67 is zero, transistor 74 is off, and hence no reduction current is supplied be transistor 74 to resistor 72. There is no laser light except that light due to the laser bias current provided by biasing circuit 62.

Where an image signal is present, transistor 71 is on and a current sink circuit programmed by resistor 72 for maximum laser light power out is established. Accordingly, the light power output of diode 15 starts increasing. Photodiode 65 responds with an increasing photocurrent into resistor 66 with corresponding increase in voltage level at the negative input of amplifier 67. So long as the voltage level is less than the laser power setpoint established by resistor 68, the output of amplifier 67 remains zero and transistor 74 stays off.

When the voltage at the negative input of amplifier 67 increases above the laser power setpoint, transistor 71 is turned on enough to supply current into resistor 72 reducing the sink current through transistor 71. The reduction in sink current reduces the light output of laser diode 15. Photodiode 65 senses the reduction in light output from diode 15 and decreases the voltage at the negative input of amplifier 67. The foregoing continues until an equilibrium state is reached when the voltage drop across resistor 66 is settled to the laser power desired as determined by the laser power setting of resistor 68. As a result, substantially constant laser power is provided through the remaining time that the image signal is on.

Figure 3:
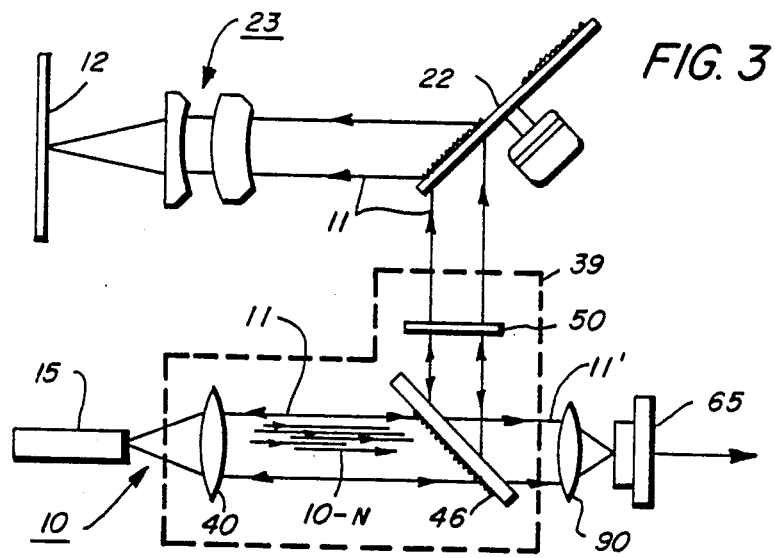
FIG. 3 is a schematic view of a second embodiment in which the intensity of the zero order beam after passing through the transmissive wavelength selecting element of the external cavity is monitored.

Referring now to the embodiment shown in FIG. 3 of the drawings, where like numbers refer to like parts, the location for sampling the power output of laser diode 15 is changed to sample the normally unused zero order beam 11' passing through a transmissive wavelength selecting element, shown here as grating 46. A suitable lens 90 may be provided to focus the zero order beam 11' onto photodiode 65.

Figure 4:
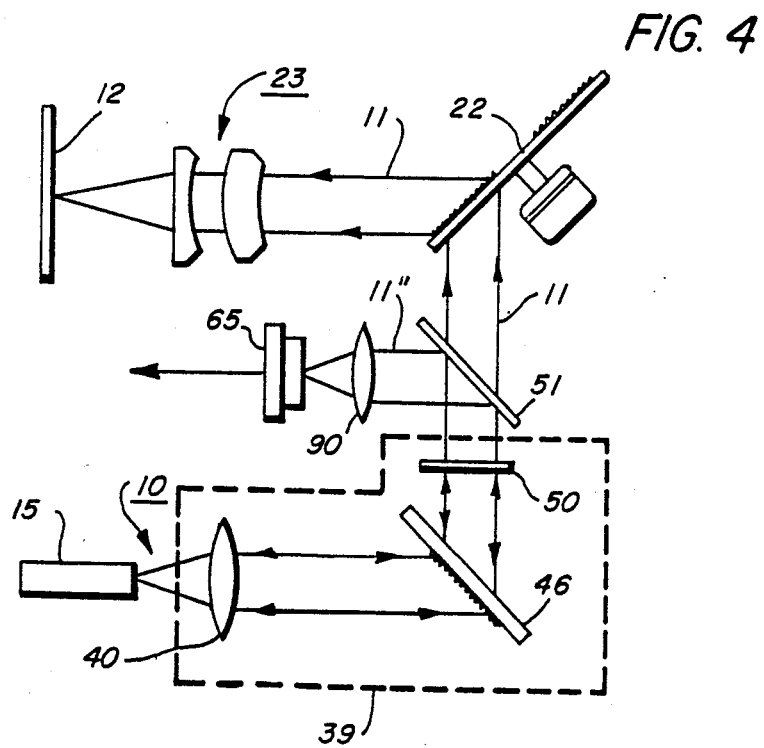
FIG. 4 is a schematic view of a third embodiment in which the intensity of the laser beam at the output of the external cavity is monitored.

In the emobidment shown in FIG. 4, where like numbers refer to like parts, the power output of laser diode 15 is sampled at the output of external cavity 39 by reflecting a known (designated by 11'') of the output beam 11 onto photodiode 65. For this purpose, a partially reflecting mirror 51 is interposed between mirror 50 and disc 22. As a result, photodiode 65 is exposed to the beam at the operating wavelength selected. A lens 90 may be provided to focus the fractional beam 11'' onto photodiode 65.

In the embodiment shown in FIG. 5, where like numbers refer to like parts, the power output of diode 15 is sampled through the normally unused zero order beam 11' after passage through facets 24 of holographic disc 22. A lens 90 may be provided to focus the zero order beam 11' onto photodiode 65. In this embodiment, the amount of light detected depends not only on the light incident upon the facets 24 of disc 22 but also on the diffraction efficiency of facets 24. Accordingly, this embodiment provides correction not only for variations in the light emitted by laser diode 15 but also for facet-to-facet and in-facet variations in the diffraction efficiency of the holographic disc 22.

In this embodiment, as will be understood by those skilled in the art, appropriate modifications would be made to pixel power correction circuit 60 to assure optimum uniformity across the scan line. Particularly this would include changes and adjustments to account for variations in the diffraction efficiency of the facets 24 that results with changes in scan angle.

It will be understood that the lens 90 of the FIGS. 3, 4 and 5 embodiments may be dispensed with where photodiode 65 is sufficiently large.

While the invention has been described with reference to the structure disclosed, it is not confined to the details set forth, but is intended to cover such modifications or changes as may come within the scope of the following claims.

What is claimed is:

1. In a raster output scanner, the combination of:
   (a) a laser diode with an internal lasing cavity having front and rear facets as the source of a high intensity scanning beam;
   (b) an optical system for scanning and focusing said beam on a recording member including a rotatable holographic scanning element;
   (c) converting means for converting the laser diode internal lasing cavity to an external lasing cavity to inhibit diode mode hopping, said converting means including
      (1) an anti-reflective covering on the front facet to convert the laser diode internal cavity to a gain medium,
      (2) means for collimating the light output of said diode into parallel light beams,
      (3) transmissive wavelength selecting means for dispersing said light beams in accordance with the wavelength of the individual light beams, and
      (4) means to reflect a predetermined one of the light beams back on itself and against the laser diode internal cavity rear facet whereby the laser diode is forced to operate in a single mode corresponding to the wavelength of the predetermined light beam; and
   (d) means for correcting for diode power variations resulting from conversion of said laser diode internal cavity to said external cavity by said converting means including
      (1) means to sampling the power output of said laser diode following conversion of said laser diode internal cavity to said external cavity to provide a signal representing diode power output;
      (2) means for comparing said signal with a predetermined reference signal to provide a control signal; and
      (3) means for adjusting the power input to said laser diode in response to said control signal to maintain substantially constant laser diode power while inhibiting laser diode mode hopping.

2. The scanner according to claim 1 in which said sampling means samples light emitted from said laser diode rear facet.

3. The scanner according to claim 1 in which said sampling means samples the zero order beam passing through said transmission wavelength selecting means.

4. The scanner according to claim 1 in which said sampling means samples the light output of said laser diode at the output of said external cavity.

5. The scanner according to claim 1 in which said scanning element comprises a transmissive holographic disc having successive grating facets about the periphery thereof,
   said sampling means sampling the zero order component of said scanning beam undiffracted by said holographic disc grating facets.

6. The scanner according to claim 1 in which said sampling means includes:
   (a) a light detector for converting light impinging thereon to said signal, and
   (b) lens means for focusing said light from said laser diode on said light detector.

7. In a raster output scanner the combination of:
   (a) a laser diode with an internal lasing cavity with front and rear facets as the source of a high intensity scanning beam,
   (b) an optical system for scanning and focusing the beam on a recording member including a rotatable holographic scanning element,
   (c) converting means for converting the laser diode internal lasing cavity to an external lasing cavity to inhibit diode mode hopping, said converting means including
      (1) an anti-reflective covering on the front facet to convert the laser diode internal cavity to a gain medium,
      (2) means for collimating the light output of said diode into parallel light beams,
      (3) transmissive wavelength selecting means for dispersing said light beams in accordance with the wavelength of the individual light beams, and
      (4) means to reflect a predetermined one of the light beams back on itself and against the laser diode internal cavity rear facet whereby the laser diode is forced to operate in a single mode corresponding to the wavelength of the predetermined light beam; and
   (d) means for correcting for diode power variations resulting from conversion of said laser diode internal cavity to said external cavity by said converting means, said correcting means including
      (1) comparator means,
      (2) photosensitive means for monitoring the intensity of the beam output by said laser diode, said photosensitive means generating a first potential representative of the instantaneous intensity of the beam output of said laser diode to one input of said comparator means;
      (3) means providing a preset second potential representative of desired laser diode beam intensity to a second input of said comparator means;
      said comparator means comparing said first and second potentials to provide an intensity control signal;
      (4) first control means responsive to an image signal to provide maximum sink current through said laser diode to actuate said laser diode whereby said laser diode generates a beam of maximum intensity; and
      (5) second control means adapted when said beam reaches a predetermined intensity to reduce said sink current through said laser diode to reduce the intensity of said laser diode beam in response to said intensity control signal whereby the intensity of the laser diode beam is adjusted to provide said desired beam intensity.

8. The scanner according to claim 7 in which said first control means terminates said sink current in the absence of said image signal whereby said laser diode is inoperative.

9. The scanner according to claim 7 in which said photosensitive means monitors said laser beam intensity through said laser diode rear facet.

10. The scanner according to claim 7 in which said photosensitive means monitors the intensity of the zero order beam passing through said transmissive wavelength selecting means.

11. The scanner according to claim 7 in which said photosensitive means monitors the intensity of the laser diode beam at the output of said external cavity.

12. The scanner according to claim 7 in which said scanning element comprises a transmissive holographic disc having a plurality of grating facets, said photosensitive means monitoring the zero order component of said scanning beam at said grating facets.

* * * * *